(12) United States Patent
Karlsson (10) Patent No.: US 8,418,099 B2
(45) Date of Patent: Apr. 9, 2013

(54) PERFORMANCE COUNTERS FOR INTEGRATED CIRCUITS

(75) Inventor: Martin Karlsson, Stockholm (SE)

(73) Assignee: Oracle International Corporation, Redwood Shores, CA (US)

(*) Notice: Subject to any disclaimer, the term of this patent is extended or adjusted under 35 U.S.C. 154(b) by 5 days.

(21) Appl. No.: 13/042,646

(22) Filed: Mar. 8, 2011

(65) Prior Publication Data
US 2012/0233578 A1    Sep. 13, 2012

(51) Int. Cl.
*G06F 17/50* (2006.01)
*G06F 9/455* (2006.01)
*G06F 9/45* (2006.01)

(52) U.S. Cl.
USPC ............ 716/106; 716/111; 703/22; 703/23; 703/28

(58) Field of Classification Search .......... 716/106, 716/111; 703/22, 23, 38
See application file for complete search history.

(56) References Cited

U.S. PATENT DOCUMENTS

| | | | |
|---|---|---|---|
| 6,195,629 B1 * | 2/2001 | Bargh et al. ............. | 703/17 |
| 7,194,705 B1 | 3/2007 | Deepak et al. | |
| 7,418,678 B1 * | 8/2008 | Ip et al. ............. | 716/106 |
| 7,774,531 B1 | 8/2010 | Karlsson | |
| 2001/0011212 A1 * | 8/2001 | Raynaud et al. ......... | 703/22 |
| 2003/0225559 A1 * | 12/2003 | Sharma ............. | 703/16 |
| 2004/0025122 A1 * | 2/2004 | Schubert et al. ......... | 716/4 |
| 2005/0198606 A1 | 9/2005 | Gupta et al. | |
| 2006/0052994 A1 | 3/2006 | Takei | |
| 2008/0168057 A1 * | 7/2008 | Gabele et al. ......... | 707/5 |
| 2008/0195368 A1 * | 8/2008 | Bobok et al. ............. | 703/16 |
| 2008/0249758 A1 * | 10/2008 | Gabele et al. ......... | 703/14 |
| 2010/0153083 A1 * | 6/2010 | Bobok et al. ............. | 703/13 |

OTHER PUBLICATIONS

Wallin, et al., VASA, A Simulator Infrastructure With Adjustable Fidelity, Dept. of Information Technology, Uppsala University, Uppsala, Sweden, pp. 1-10, 2005.
Chaudhry et al.; IRock: A High-Performance Sparc CMT Processor; Published by the IEEE Computer Society; 2009; pp. 6-16.

* cited by examiner

*Primary Examiner* — Suresh Memula
(74) *Attorney, Agent, or Firm* — Kraguljac Law Group LLC (57) ABSTRACT

Systems, methods, and other embodiments associated with performance counters are described. In one embodiment, a method includes generating a first register transfer level (RTL) description of an integrated circuit that includes a performance counter. The integrated circuit is emulated in hardware and statistical data is collected with the performance counter. The performance counter is then removed from the integrated circuit.

15 Claims, 6 Drawing Sheets

Figure 6

PERFORMANCE COUNTERS FOR INTEGRATED CIRCUITS

BACKGROUND

In general, integrated circuit (IC) chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released. Due to the complexity of chip development, the time from an almost complete design to silicon availability is a long one.

As chip designs have become more complex, shortcomings in existing chip verification methodologies, which extend time-to-market have become evident. Typically, until a chip is actually fabricated in silicon, a simulator is used to verify the design. A "simulator" refers to specialized software that simulates a circuit, which allows performance projections to be obtained. In general, simulators are used both for correctness verification and performance verification. Performance simulators are typically written in a high-level language such as C or Java. The performance simulator is therefore an abstracted model of the actual design lacking much of the detail in the actual design.

However software models are never completely accurate. Therefore chip projects suffer from significant risks until the performance of the design has been validated using silicon. The lack of performance for a chip can be equally problematic to the viability of a chip project as a correctness error. Therefore accurate modeling and estimations of chip performance is important for a chip project. Being able to verify performance projections early can to a large extent mitigate this risk.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. One of ordinary skill in the art will appreciate that in some embodiments one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Systems and methods are described herein that relate to statistic gathering and storing circuits. The statistic circuits are referred to herein as soft performance counters because they are added and removed from a circuit. Thus, even though the performance counters are implemented as hardware components, they are temporary and/or removable components because they are removed from the final circuit design. In one embodiment, the soft performance counters are configured to extract statistical data from register transfer level (RTL) emulation.

In one embodiment, one or more performance counters are used during the circuit development process and are removed from the final design (e.g. removed from the final silicon netlist). Since the performance counters are not part of the final silicon netlist and thus do not appear in the final integrated circuit chip, the performance counters do not have to obey chip space and complexity limitations that permanent performance counters follow. For example, a complex performance counter that is permanent in a circuit may occupy 10% of the entire chip area or more. Taking up such a large space is difficult to justify due to the increased chip cost.

Figure 1:
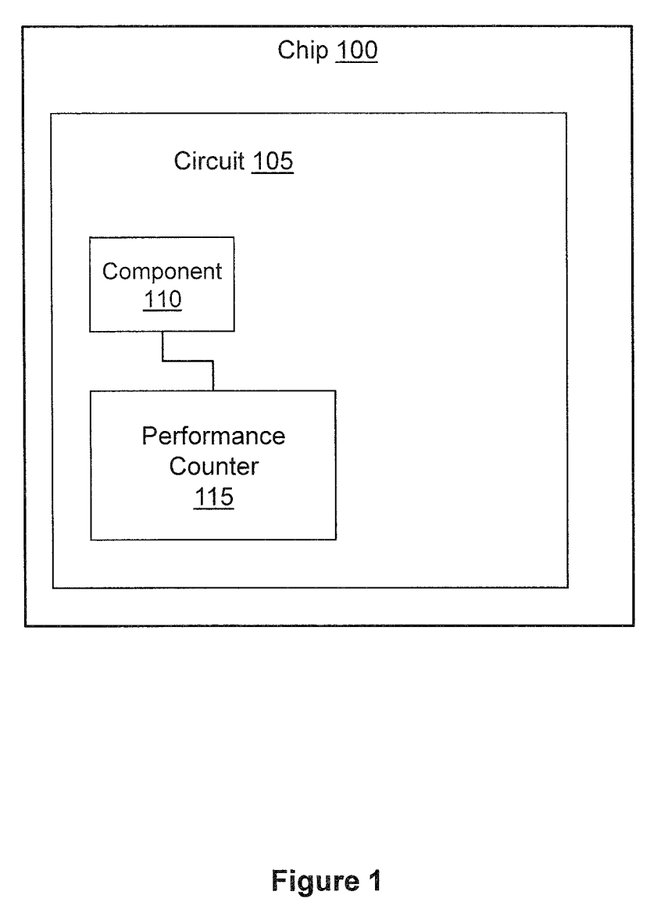
FIG. 1 illustrates one embodiment of a circuit including a performance counter.

For example, FIG. 1 illustrates one embodiment of a representation of a chip 100. The chip 100 includes an integrated circuit 105 and may contain multiple circuits, one or more processor cores, other components, and so on. One component 110 in the circuit 105 is shown with a performance counter 115 connected to it (e.g. connected to one or more input/output signal lines). Although FIG. 1 is not drawn to scale, the size of the performance counter circuit 115 is typically much larger than the component 110 that it collects data from.

Accordingly, a chip designer has more freedom to implement and use the present temporary performance counters without sacrificing chip area and without affecting signal timing of other circuit components. As a result, larger and more complex performance counters can be used during design validation. Through the use of these counters, a wider and more advanced set of statistics can be extracted from the real RTL design. The statistics are then used to verify performance and/or behavior of the circuit well before the real chip silicon is fabricated. Thus more accurate debugging can be performed to correct the circuit design before fabrication of the chip and thereby reducing chip project risk. The collected statistics can include other forms of information such as addresses to enable further performance debugging.

Figure 2:
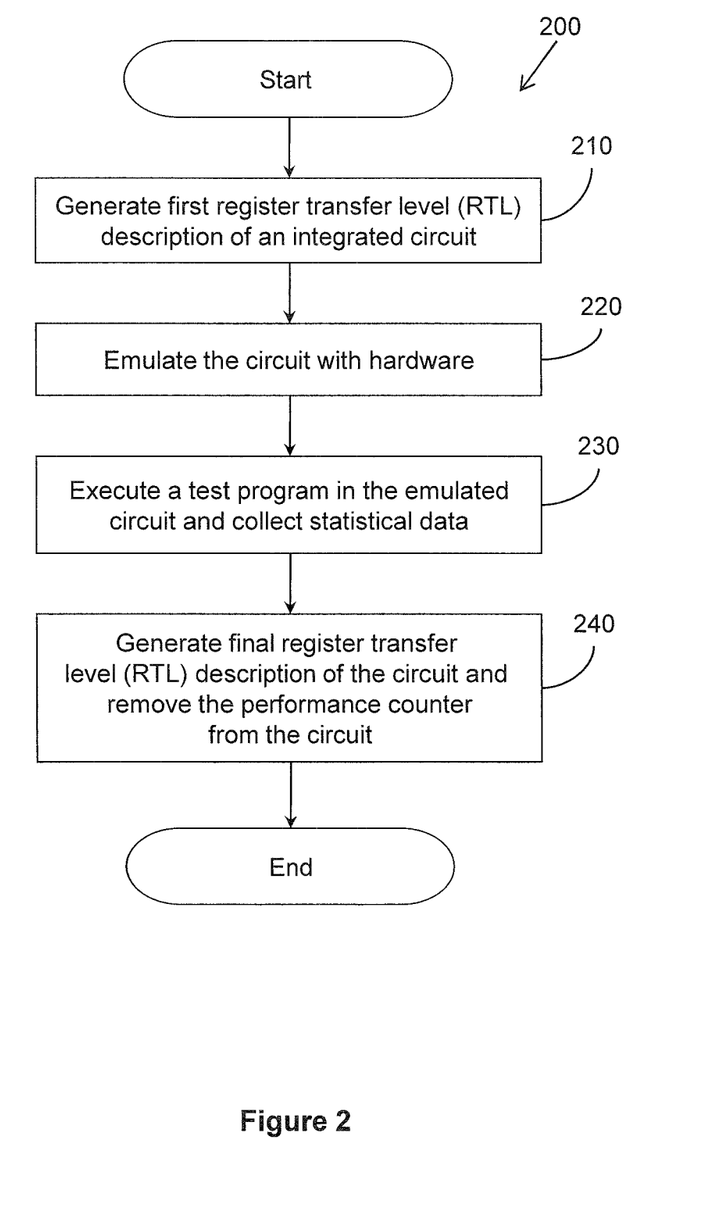
FIG. 2 illustrates another embodiment of a method associated with collecting statistical data from a circuit.

With reference to FIG. 2, one embodiment of a method 200 is shown that is associated with designing an integrated circuit and/or a chip. For the purposes of discussion, assume that the design process has reached a point where a hardware description language has been used to define a chip model and the design is ready for the register transfer level (RTL). The chip model includes one or more performance counters defined and connected to selected signal lines and/or components within the chip model. The specific function of the performance counter is not critical to this description beyond the general function of collecting some performance data during run-time. Some examples are described below.

At 210, a first register transfer level (RTL) description of the integrated circuit is generated that includes a performance counter defined therein. In one embodiment, computer languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) and/or the behavioral level using abstract data types.

In designing an integrated circuit with an HDL source code, the source code is first written and then compiled by an HDL compiler. The HDL source code describes at some level the circuit elements, and the compiler produces an RTL description (e.g. RTL netlist) from the compilation. The RTL description describes the performance counter as connected to a component in the integrated circuit (e.g. connected to one or more input/output signal lines) and is configured to collect signals from the circuit. A chip designer is typically responsible for determining where and how the performance counter is connected to the circuit and the interconnections to input and/or output lines.

At 220, after the circuit is designed, the circuit is emulated with hardware. For example, the circuit design is loaded or otherwise programmed into programmable/reconfigurable hardware logic. In one embodiment, the methodology uses the real design and reconfigurable logic such as field programmable gate arrays (FPGA's) to emulate and validate performance estimations of the circuit design. Using hardware to emulate the circuit is very accurate with regard to the design as compared to a pure software simulation of the circuit. Furthermore, FPGA emulation is orders of magnitude faster than software simulation and can therefore provide a much safer statistical performance result. Since FPGA's are parallel in nature (contrary to most software simulators), the FPGA emulator can execute multiple processor cores in parallel (if the design includes such cores) further increasing the accuracy of the emulation and collection of run-time statistics.

Hardware emulation is often made deterministic. That is rerunning the same emulation multiple times yields exactly the same execution. This can be used to iteratively extract information from an emulation. Consider the following example. After an emulation using a complex soft performance counter, suppose one finds that a couple of memory accesses take a very long time. Additional soft performance counters can be added to collect data from these specific memory accesses (e.g., extracting the addresses of these memory accesses). In a third emulation, one could then extract information about what is actually happening to these specific addresses. Suppose address X is one address in question. By collecting data, issues may be determined like is the system experiencing a TLB miss for address X? Does it then miss in the L2 cache? (and so forth). Determinism is important because if the emulation would not have been deterministic, like for example if you rerun the same program twice on real hardware, then the same performance problem may not show up every time. A performance problem can be quite elusive and only show up every now and then and still occur frequently enough so that the performance impact is severe.

With further reference to FIG. 2, at 230, the emulation includes executing a test program in the emulated circuit and statistical data is collected with the performance counter(s) as the emulated circuit runs the test program. The test program is run for a desired time (e.g., a designated time or a condition when to stop) to obtain enough statistical data so that the performance of the design is validated as much as possible. Of course, complete validation is difficult. Example run times may be one hour, several hours, a number of cycles or instructions, or more extensive periods depending on the design complexity and the amount of statistics desired. Different designated times or stop conditions can be input as a parameter.

Figure 4:
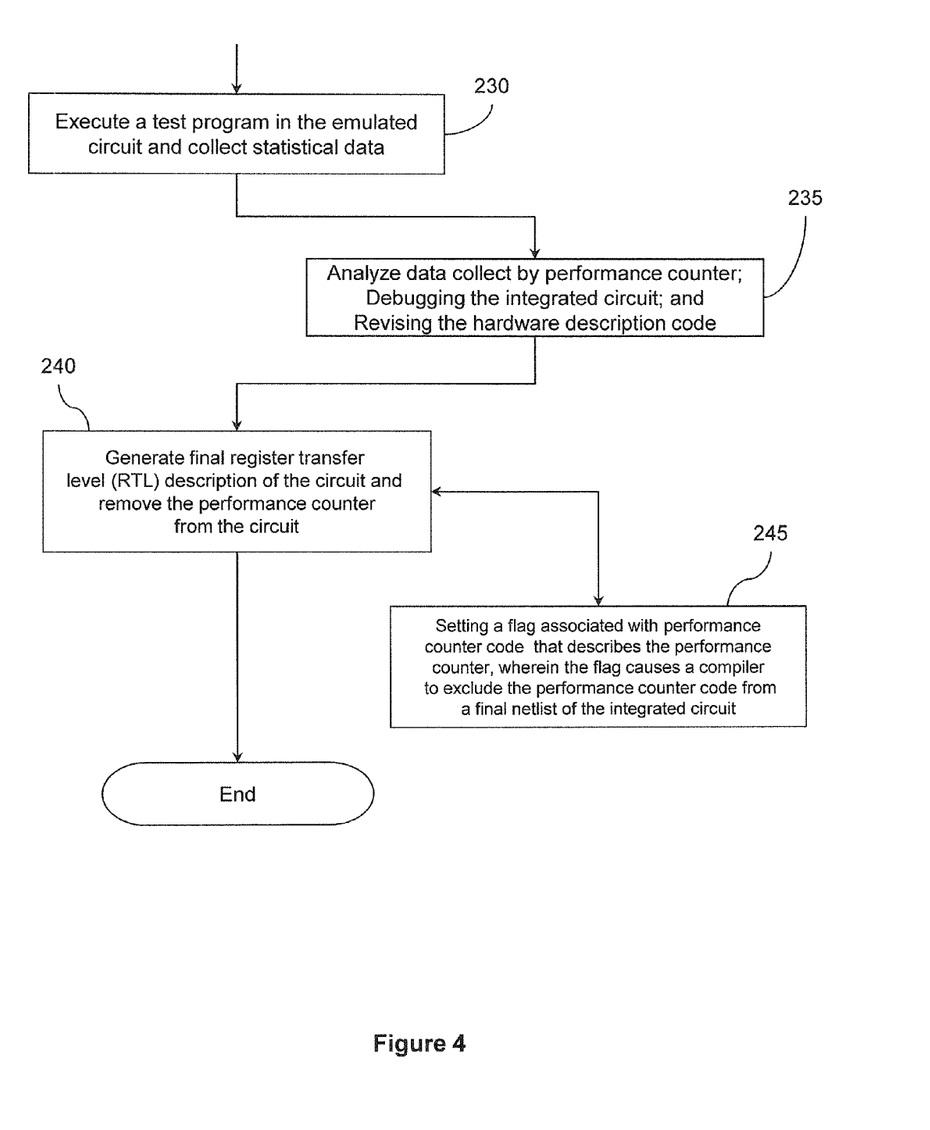
FIG. 4 illustrates another embodiment of method 200 of FIG. 2.

In another embodiment of FIG. 2 after 230, with reference to FIG. 4 at block 235, the statistical data collected by the performance counter(s) in the circuit are then analyzed to determine if the circuit performed and/or behaved as expected. The collected data is used to debug the circuit and the circuit is redesigned as needed by revising the hardware description language that defines the circuit. The emulation, validation, and redesign of the circuit may be repeated a number of times until the circuit performs as desired.

At 240, after the statistical data is collected and the circuit is validated, a final register transfer level (RTL) description of the integrated circuit is generated where the performance counter is removed from the integrated circuit. A final netlist is then generated from the RTL description and the netlist is sent out for chip fabrication. Since the performance counter is removed from the circuit, the performance counter is a temporary component in the circuit and does not appear in the final circuit design or in the fabricated physical circuit. As stated above, designing the circuit with temporary performance counters allows for more complex and/or elaborate collection of performance statistics during design validation. However, space on the final silicon fabrication of the chip is not sacrificed because the temporary counters are removed.

In one embodiment, the performance counter is removed from the circuit as follows. The RTL description includes source code that describes the performance counter. The source code includes a flag/setting that functions as an instruction to the RTL compiler (FIG. 4, block 245). When the flag is set with one value (e.g. "off", "0", and so on), the flag causes the compiler to exclude the performance counter code from the netlist of the integrated circuit that is generated from the compiler. If the flag is set with the opposite value (e.g. "on", "1", and so on), the flag causes the compiler to include the performance counter code in the netlist. In another embodiment, the code that defines the performance counter is deleted from the source code.

Figure 6:
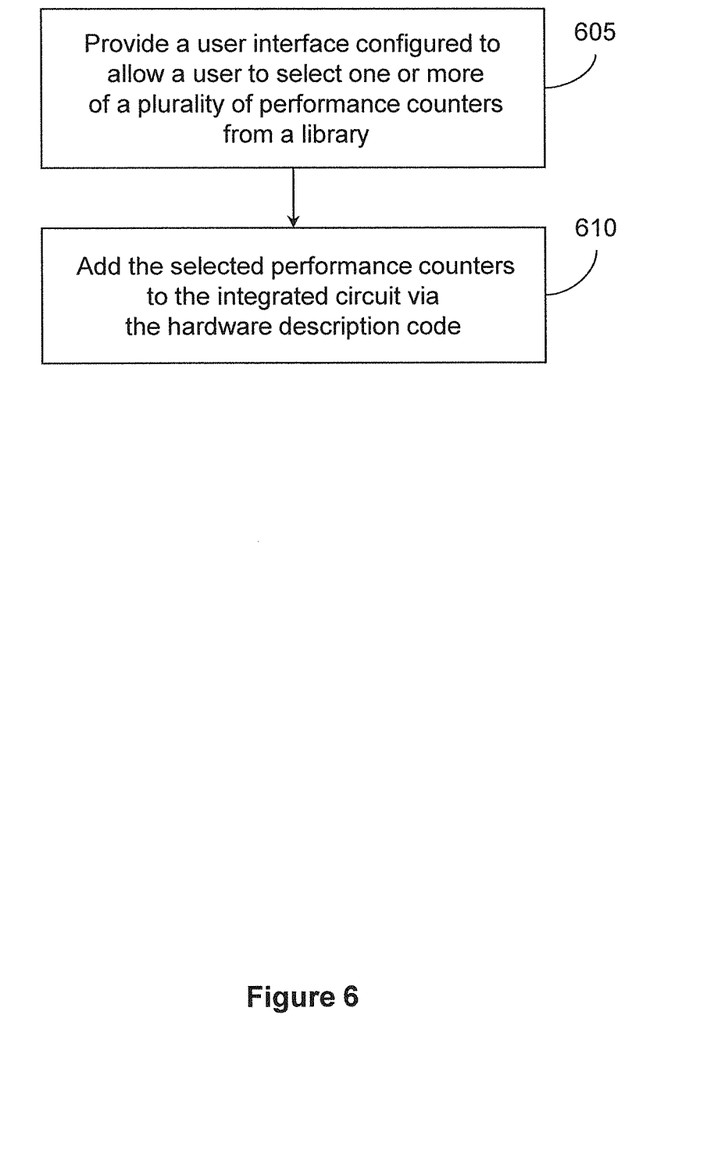
FIG. 6 illustrates another embodiment of method 200 of FIG. 2.

Since the performance counters are temporary and removable, another embodiment of the method 200 includes (as seen in FIG. 6 block 605), providing an interface for inserting or removing the performance counter code into/from the circuit design. For example, the performance counter code is selected from a software library of performance counters prior to generating the first register transfer level (RTL) description at block 210. Then, at block 610, the selected performance counter code is added to the integrated circuit design via the first register transfer level (RTL) description. Thus a library of preconfigured performance counters can be stored and made available to a circuit designer.

Figure 5:
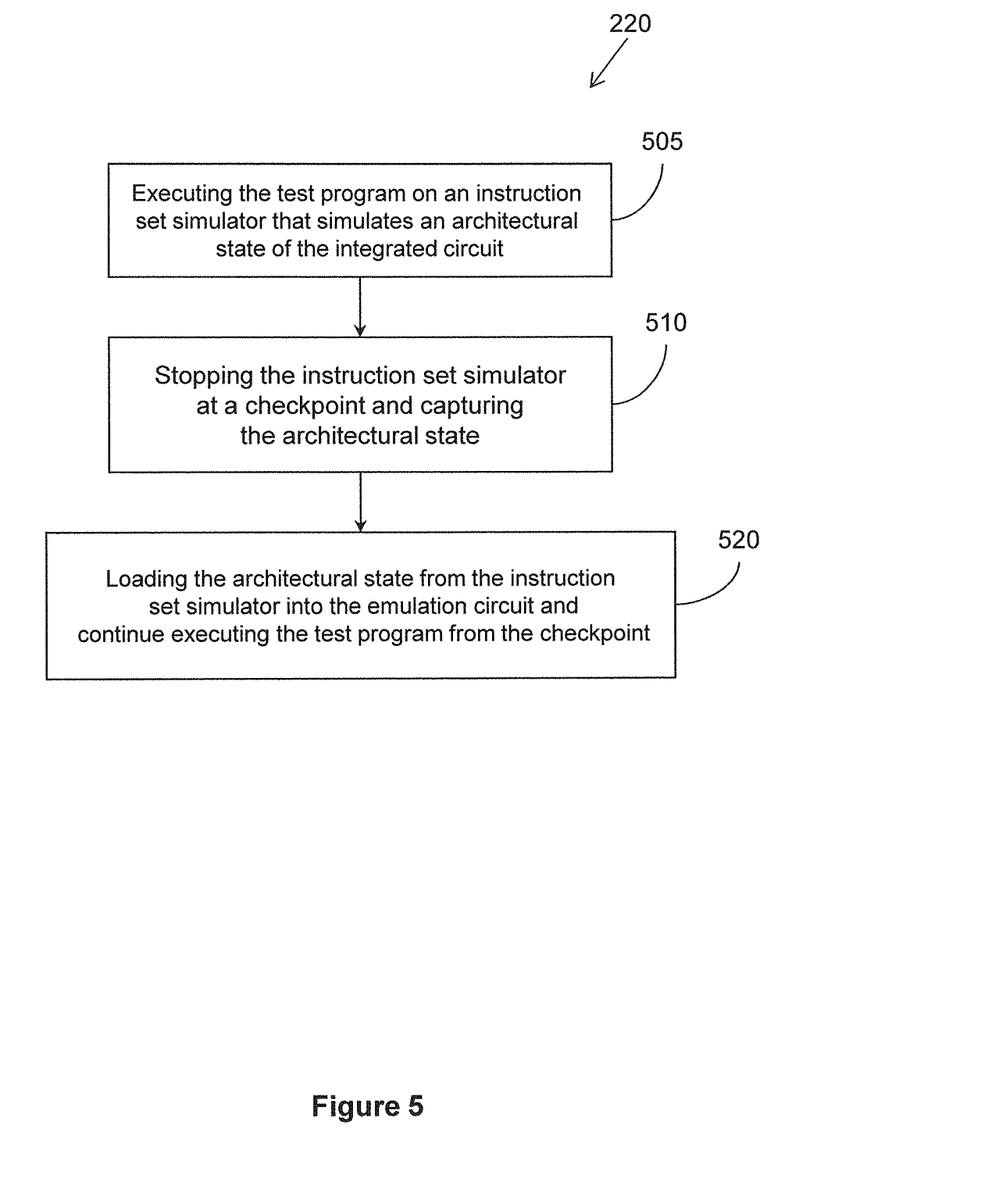
FIG. 5 illustrates another embodiment of block 220 from FIG. 2.

In another embodiment, the emulation function at block 220 includes performing a simulation before the emulation is performed. With reference to FIG. 5, for example at block 505, the test program is first executed on an instruction set simulator that simulates an architectural state of the integrated circuit. After a certain amount of time, the instruction set simulator is stopped at a checkpoint and the architectural state is captured (block 510). For example at the checkpoint, data values in all registers and memories in the simulated circuit are stored. This includes a register that stores a program counter, which keeps track of where the test program is in the execution. The architectural state from the instruction set simulator is then loaded into the emulation hardware to recreate the state of the circuit at the checkpoint (block 520) (e.g. data values are loaded into corresponding registers in the emulation hardware). The captured checkpoint state also includes the entire memory state. In one embodiment, the emulation hardware is loaded with the RTL design of the processor before the checkpoint state is loaded. The test program is then executed in the emulation hardware and continued from the checkpoint position as indicated by the program counter. Execution continues and the statistical data is collected by the performance counter(s) (e.g. both conventional and soft performance counters) in the emulation hardware. One reason for using a software instruction set simulator is that it (contrary to a performance estimating architectural model) is significantly faster than emulation and is used to fast forward to sections of programs that are interesting from a performance standpoint. For example it may take many hours to emulate the startup of a program and even though the program is only performed once, it is not that critical or interesting for performance reasons.

As stated previously, the specific function of the performance counter is not critical to this description. The performance counter is configured to collecting some performance data during run-time. The performance counter can be as simple as counting the number of occurrences of a signal or more complex such as determining a distribution function from collected signals. Other examples may include counting the number of data and/or instruction misses in a translation lookaside buffer (TLB). By using the removable performance counters herein, a circuit can be designed to count both data and instruction misses simultaneously without sacrificing chip area on the silicon. Another example performance counter can be configured to measure a distribution of the number of cycles it takes for a data request to return from a memory system. Buckets can be created with registers to store and count data. This can be used to find memory access latency in the circuit. For example, buckets can be used to get information about a distribution such as implementing 128 32-bit counters where counter zero counts the number of accesses with a latency 0-10 cycles, counter one counts number of accesses with a latency of 11-20, counter two counts the number of accesses with a latency of 21-30, and so on.

Another example counter is one that measures accesses for each index in a branch predictor. The counter can collect data and determine where conflicts occur in the branch predictor. Of course, performance counters can be implemented to perform other performance functions as desired.

Figure 3:
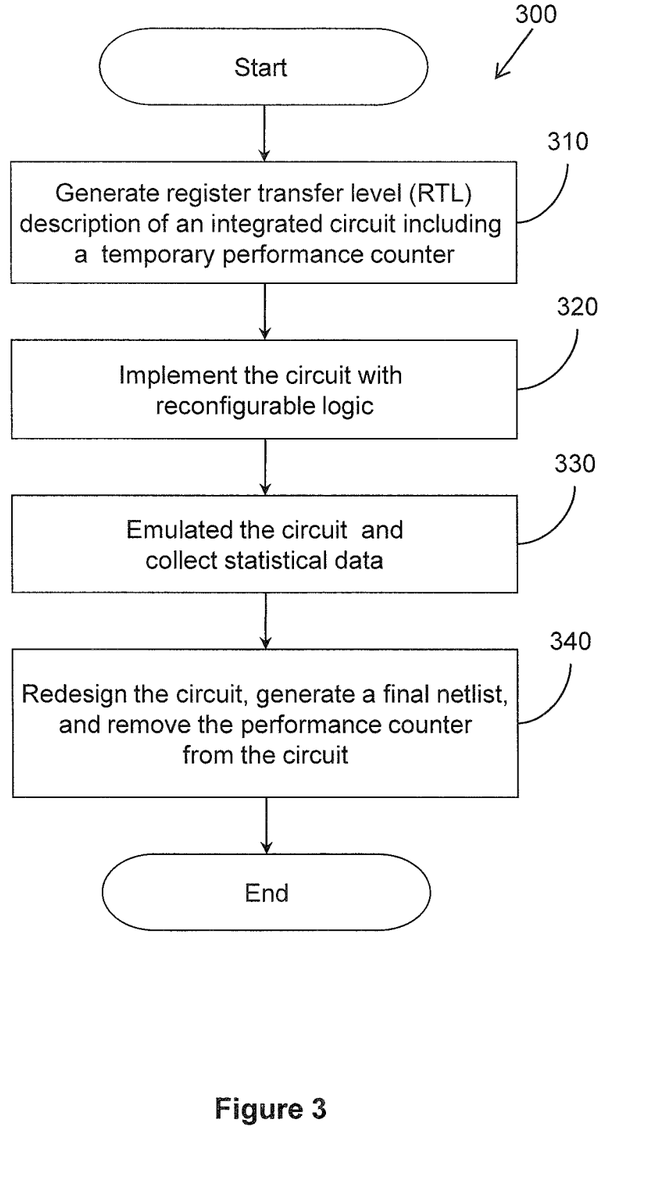
FIG. 3 illustrates another embodiment of a method associated with collecting statistical data from a circuit.

With reference to FIG. 3, one embodiment of method 300 is illustrated that is associated with collecting statistics from a circuit design. Method 300 is another embodiment of the method 200 from FIG. 2. There are similarities between method 300 and a few variations. Method 300 may be used for determining and validating the performance of one or more components in an integrated circuit design. During chip development, the integrated circuit is designed using a hardware description language (HDL). The integrated circuit includes a number of digital circuits.

At 310, a register transfer level (RTL) description of the integrated circuit is generated that includes one or more temporary performance counters. The RTL description is designed with the intention and knowledge that the performance counter will not be included in the final physical circuit. At 320, the integrated circuit is implemented in hardware using reconfigurable logic (e.g. FPGAs, programmable logic devices, and so on). At 330, the integrated circuit is emulated with the reconfigurable logic and statistical data is collected with the temporary performance counter during emulation. At 340 after emulation, the integrated circuit is redesigned (if needed) based at least in part on the statistical data that was collected. A final netlist of the integrated circuit is generated from the redesign. At the least, the redesign includes removing the temporary performance counter from the design and thus it does not appear in the physical integrated circuit that is actually fabricated. After the design has been altered, the simulation is rerun to validate the new improved behavior using the soft performance counters before the final netlist is generated, which does not include the performance counters.

In another embodiment, the described methods and/or their equivalents may be implemented with computer executable instructions. Thus, in one embodiment, a non-transitory computer-readable medium is configured with stored computer executable instructions that when executed by a machine (e.g., processor, computer, and so on) cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional blocks that are not illustrated.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
RAM: random access memory.
DRAM: dynamic RAM.
SRAM: synchronous RAM.
ROM: read only memory.
PROM: programmable ROM.
EPROM: erasable PROM.
EEPROM: electrically erasable PROM.

"Computer-readable medium", as used herein, refers to a non-transitory medium that stores instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a compact disk, other optical medium, a RAM, a ROM, a memory chip or card, a memory stick, and other media from which a computer, a processor or other electronic device can read.

"Logic", as used herein, includes but is not limited to hardware, firmware, a non-transitory computer readable medium that stores instructions, instructions in execution on a machine, and/or combinations of each to perform a function (s) or an action(s), and/or to cause a function or action from another logic, method, and/or system. Logic may include a microprocessor, a discrete logic (e.g., ASIC), an analog circuit, a digital circuit, a programmed logic device (e.g. FPGA), a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics.

In one embodiment, a computer is implemented with a design logic that is configured to perform the methods described herein or their equivalents. The computer includes at least a processor, memory, communication interfaces, storage, a display, an operating system, and so on.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is used in the detailed description or claims (e.g., A or B) it is intended to mean "A or B or both". When the applicants intend to indicate "only A or B but not both" then the phrase "only A or B but not both" will be used. Thus, use of the term "or" herein is the inclusive, and not the exclusive use. See, Bryan A. Garner, A Dictionary of Modern Legal Usage 624 (2d. Ed. 1995).

What is claimed is:

1. A method, comprising:
    generating a first register transfer level (RTL) description of an integrated circuit that includes a performance counter;
    emulating the integrated circuit in hardware using one or more field programmable gate arrays;
    executing a test program in the emulated integrated circuit and collecting data with the performance counter; and
    after the data is collected, generating a second register transfer level (RTL) description of the integrated circuit where the performance counter is removed from the integrated circuit.

2. The method of claim 1, wherein the first register transfer level (RTL) description describes the performance counter as connected to a component in the integrated circuit and configured to collect signals from the component.

3. The method of claim 1, wherein generating the second register transfer level (RTL) description includes setting a flag for code that describes the performance counter, where the flag causes a compiler to exclude the code from a netlist of the integrated circuit.

4. The method of claim 1, wherein emulating the integrated circuit in hardware comprises loading a circuit design of the integrated circuit into the one or more field programmable gate arrays that are configured to function to emulate the integrated circuit.

5. The method of claim 1, wherein emulating the integrated circuit comprises:
    executing the test program on an instruction set simulator that simulates an architectural state of the integrated circuit; and
    stopping the instruction set simulator at a checkpoint and capturing the architectural state;
    wherein executing the test program in the emulated integrated circuit comprises loading the architectural state from the instruction set simulator into the hardware and continue executing the test program from the checkpoint.

6. The method of claim 1, wherein after the statistical data is collected, the method comprises:
    analyzing the data from the performance counter and debugging the integrated circuit; and
    revising the first register transfer level (RTL) description based on the debugging to generate the second register transfer level (RTL) description.

7. The method of claim 1, further including:
    selecting the performance counter from a software library of performance counters prior to generating the first register transfer level (RTL) description; and
    adding the selected performance counter to the integrated circuit via the first register transfer level (RTL) description.

8. A non-transitory computer-readable medium storing computer-executable instructions that when executed by a computer cause the computer to perform a method, the method comprising:
    generating a hardware description code that describes an integrated circuit;
    wherein the hardware description code includes a description of a performance counter that is configured to connect to and collect run time data from a component within the integrated circuit;
    generating an emulation circuit of the integrated circuit including the performance counter into a reconfigurable logic using the hardware description code;
    executing a test program using the emulation circuit;
    collecting data with the performance counter during the execution of the test program; and
    after a designated time, ending the execution and reconfiguring the hardware description code to remove the performance counter from the integrated circuit.

9. The non-transitory computer-readable medium of claim 8, wherein the reconfigurable logic comprises at least one field programmable gate array (FPGA).

10. The non-transitory computer-readable medium of claim 8, wherein reconfiguring the hardware description code comprises setting a flag associated with performance counter code that describes the performance counter, wherein the flag causes a compiler to exclude the performance counter code from a final netlist of the integrated circuit.

11. The non-transitory computer-readable medium of claim 8, wherein generating the hardware description code comprises generating a register transfer level (RTL) description that describes digital circuits in the integrated circuit and interconnections to inputs and outputs.

12. The non-transitory computer-readable medium of claim 8, further comprising:
    executing the test program on an instruction set simulator that simulates an architectural state of the integrated circuit;
    stopping the instruction set simulator at a checkpoint and capturing the architectural state; and wherein executing the test program in the emulation circuit comprises loading the architectural state from the instruction set simulator into the emulation circuit and continue executing the test program from the checkpoint.

13. The non-transitory computer-readable medium of claim 8, wherein after the execution of the test program is ended, the method comprises analyzing the data collected by the performance counter and debugging the integrated circuit; and revising the hardware description code based on the debugging.

14. The non-transitory computer-readable medium of claim 8, wherein the performance counter is configured to perform a distribution function using the data collected.

15. The non-transitory computer-readable medium of claim 8, further comprising:

computer-executable instructions that when executed by a computer provide a user interface configured to allow a user to select one or more of a plurality of performance counters from a library that stores a plurality of performance counters and add the selected performance counters to the integrated circuit via the hardware description code.

* * * * *

UNITED STATES PATENT AND TRADEMARK OFFICE
CERTIFICATE OF CORRECTION

PATENT NO. : 8,418,099 B2
APPLICATION NO. : 13/042646
DATED : April 9, 2013
INVENTOR(S) : Karlsson It is certified that error appears in the above-identified patent and that said Letters Patent is hereby corrected as shown below:

In the Claims:

In column 8, line 14, in Claim 6, after "the" delete "statistical".

In column 8, line 36, in Claim 8, after "collect" delete "run time".

Signed and Sealed this
Thirtieth Day of July, 2013

Teresa Stanek Rea
*Acting Director of the United States Patent and Trademark Office*